US006904650B2

United States Patent
Chen et al.

(12) United States Patent
(10) Patent No.: US 6,904,650 B2
(45) Date of Patent: Jun. 14, 2005

(54) UNLOCKING MECHANISM

(75) Inventors: Win-Haw Chen, Taipei (TW); Yi-Ju Su, Taipei (TW)

(73) Assignee: Inventec Corporation, Taipei (TW)

(*) Notice: Subject to any disclaimer, the term of this patent is extended or adjusted under 35 U.S.C. 154(b) by 0 days.

(21) Appl. No.: 10/653,196

(22) Filed: Sep. 3, 2003

(65) Prior Publication Data

US 2005/0044674 A1 Mar. 3, 2005

(51) Int. Cl.[7] .............................................. H05K 7/20
(52) U.S. Cl. ........................ 24/517; 165/80.3; 361/704
(58) Field of Search ................................. 361/704, 707, 361/709, 710, 717–719, 715; 24/505, 517, 457, 601.5; 257/718, 719, 726, 727; 165/80.2, 80.3

(56) References Cited

U.S. PATENT DOCUMENTS

| | | | | | |
|---|---|---|---|---|---|
| 343,037 | A | * | 6/1886 | Klinkner | 24/601.5 |
| 5,448,449 | A | * | 9/1995 | Bright et al. | 361/704 |
| 6,344,971 | B1 | * | 2/2002 | Ju | 361/704 |
| 6,519,150 | B1 | * | 2/2003 | Chen et al. | 361/697 |
| 6,758,691 | B1 | * | 7/2004 | McHugh et al. | 439/331 |

* cited by examiner

Primary Examiner—James R. Brittain
(74) Attorney, Agent, or Firm—Rabin & Berdo, P.C.

(57) ABSTRACT

An unlocking mechanism adopted for use on retention module holder, which have a fastening stand and a locking member pivotally engaged with the fastening stand in a turn able manner. The fastening stand is for holding radiators. The locking member may be located at a latched position and a release position for latching and separating from the radiators respectively under the control of the unlocking mechanism.

4 Claims, 6 Drawing Sheets

UNLOCKING MECHANISM

FIELD OF THE INVENTION

The invention relates to an unlocking mechanism and particularly to an unlocking mechanism adopted for use on a retention module holder.

BACKGROUND OF THE INVENTION

Referring to FIG. 1, a conventional retention module holder generally includes two sets of symmetrical clamp mechanisms 5 and 6. Each clamp mechanism 5 has an upper coupling member 51 and a lower coupling member 52. The upper coupling member 51 includes a middle section 53 and two latch arms 54 extending from two sides of the middle section 53. The middle section 53 and latch arms 54 each have a latch hole 55. The lower coupling member 52 has protruding parts 56 corresponding to the latch holes 55.

Referring to FIG. 2, for assembling the clamp mechanisms 5 and 6 with a radiator 41, first, the clamp mechanisms 5 and 6 are disposed on two sides of the radiator 41; then the latch arms 54 are moved to the lower coupling member 52 and the protruding parts 56 of the lower coupling member 52 are coupled with the latch holes 55 of the upper coupling member 51, to thereby clamp the radiator 41 between the two clamp mechanisms 5 and 6 (as shown in FIG. 2).

However, the clamp mechanism for the retention module holder set forth above has one major drawback. It is very inconvenient to disassemble. It generally cannot be removed with bare hands. Hand tools such as cross-head screwdrivers are needed, which is not convenient.

As radiators are generally mounted on the mainboard to disperse heat, using hand tools such as cross-head screwdrivers to disassemble the retention module holder could easily damage the circuits of the mainboard and result in malfunction of the mainboard.

Moreover, conventional retention module holders do not have any unlocking mechanisms. Even with the aid of hand tools, users still have difficulty in removing the radiator. This is a problem remaining to be overcome.

SUMMARY OF THE INVENTION

In view of the aforesaid disadvantages, the primary object of the invention is to provide an unlocking mechanism for retention module holder to enable users to remove the radiator easily from the retention module holder without damaging the mainboard.

In order to achieve the foregoing object, the unlocking mechanism of the invention includes a fastening stand and a fastening member. The fastening stand is for holding radiators. The locking member has a pivot end on one side to pivotally engage with the fastening stand in a turn able manner, and a latch hook on the other side opposite to the pivot end. The locking member may be set in a latched position to latch the radiator and a release position to separate from the radiator.

The unlocking mechanism includes a latch ledge, a beam, a spring and a retaining part. The latch ledge is located on one side of the fastening stand opposite to the pivot end of the locking member and has an anchor hole corresponding to the locking member at the latched position. The beam is movably coupled to the fastening stand at one side corresponding to where the latch hook is located. The beam has an actuating part and a protruding part opposing the actuating part and corresponding to the latch hook at the latched position. The spring is coupled on one side of the beam distant from the protruding part to enable the protruding part to engage with the anchor hole in normal conditions, so by moving the actuating part the spring is deformed and the protruding part is moved. The retaining part is located on two sides of the beam to allow the protruding part to slide in a straight line.

At the latched position the latch hook is depressed to allow the protruding part to be wedged into the latch hook and anchor hole. Thus the locking member compresses the radiator and is deformed slightly.

At the release position, the actuating part receives force to separate the protruding part from the latch hook, and the restoring force resulting from deformation of the locking member enables the locking member to be separated from the radiator and make the radiator removable.

The foregoing, as well as additional objects, features and advantages of the invention will be more readily apparent from the following detailed description, which proceeds with reference to the accompanying drawings.

DESCRIPTION OF THE PREFERRED EMBODIMENT

Figure 1:
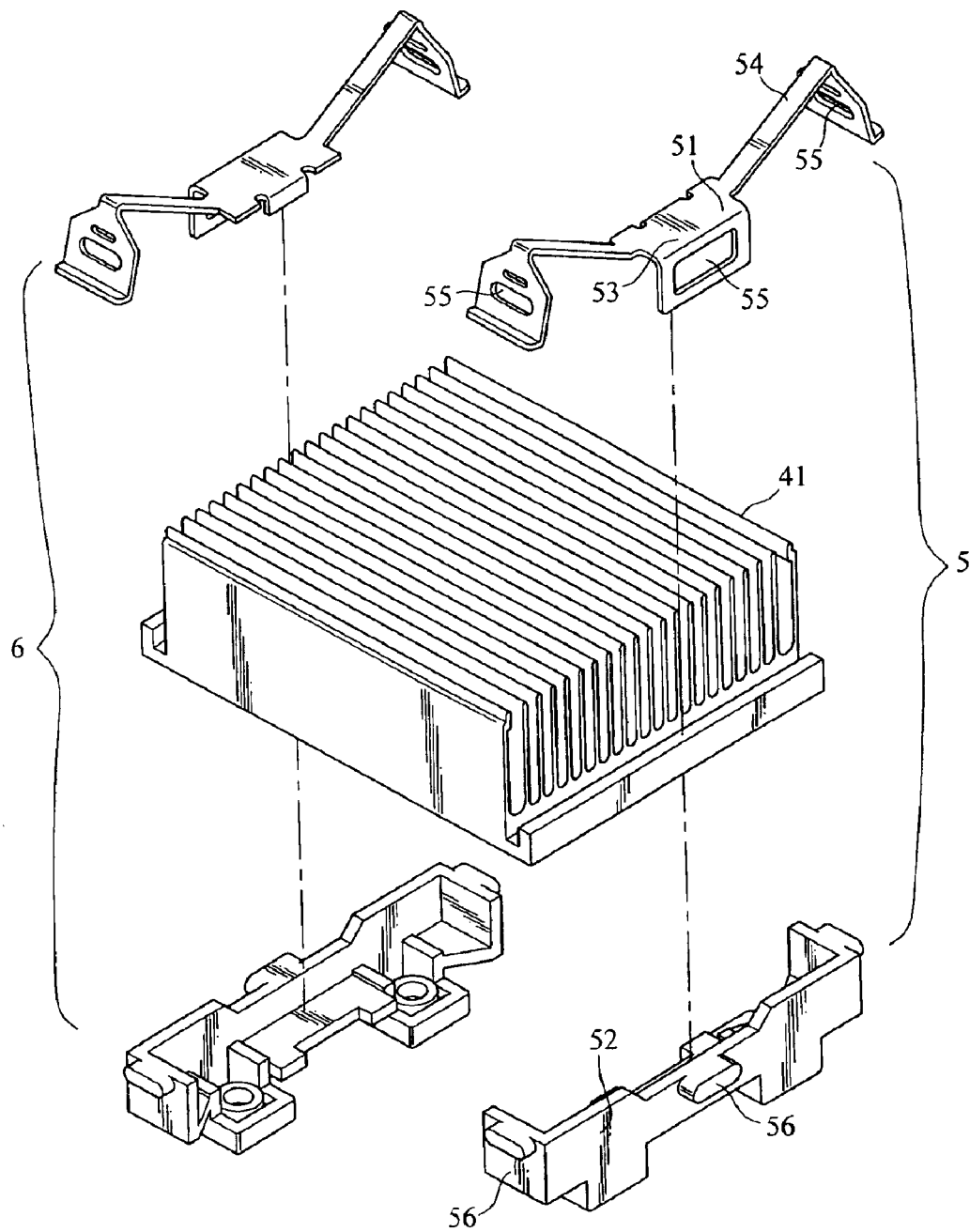
FIG. 1 is an exploded view of a conventional retention module holder.
Figure 2:
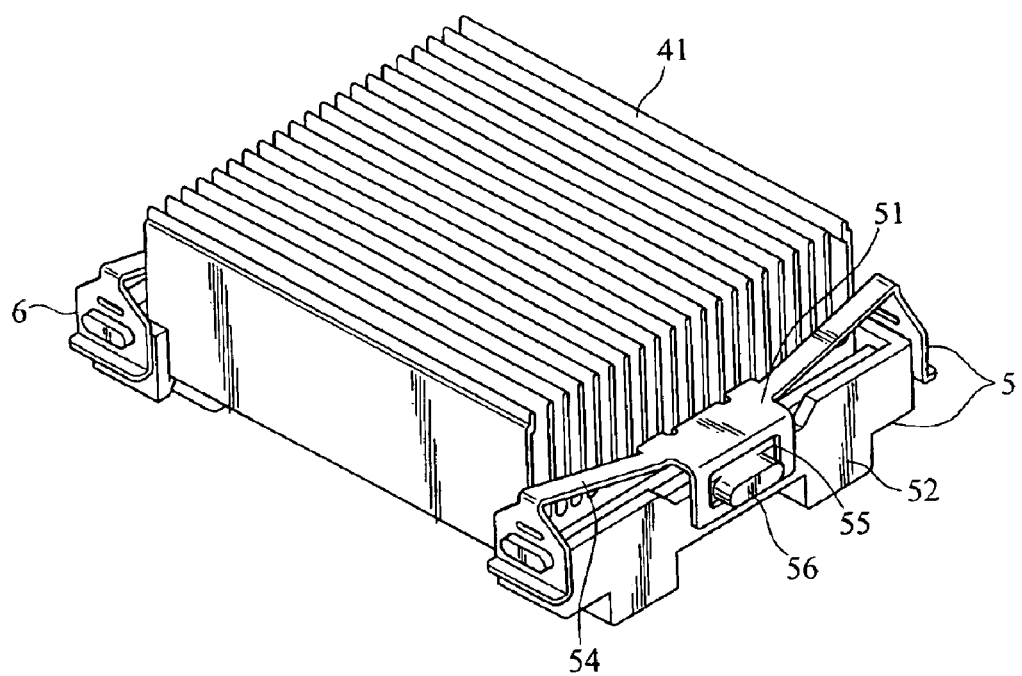
FIG. 2 is a perspective view of a conventional retention module holder coupling with a radiator.

Refer to FIGS. 3 through 6 for an embodiment of the unlocking mechanism of the invention for fastening radiators to a central processing unit (CPU, not shown in the drawings).

In the described embodiment two radiators 40 are fastened symmetrically. Of course one unlocking mechanism may be used to fasten one radiator 40 to the CPU (not shown in the drawings). In the following only one unlocking mechanism is discussed.

The retention module holder includes a fastening stand 10 and a locking member 20. The fastening stand 10 is used to hold a radiator 40, which has a plurality of radiation fins to transfer heat and disperse thermal energy from a CPU. The fastening stand 10 has a plurality of fastening holes 11 on the periphery to receive fasteners (such as screws) to fasten the fastening stand to a heat-generating device (not shown in the drawings). The heat-generating device may be a CPU.

Figure 3:
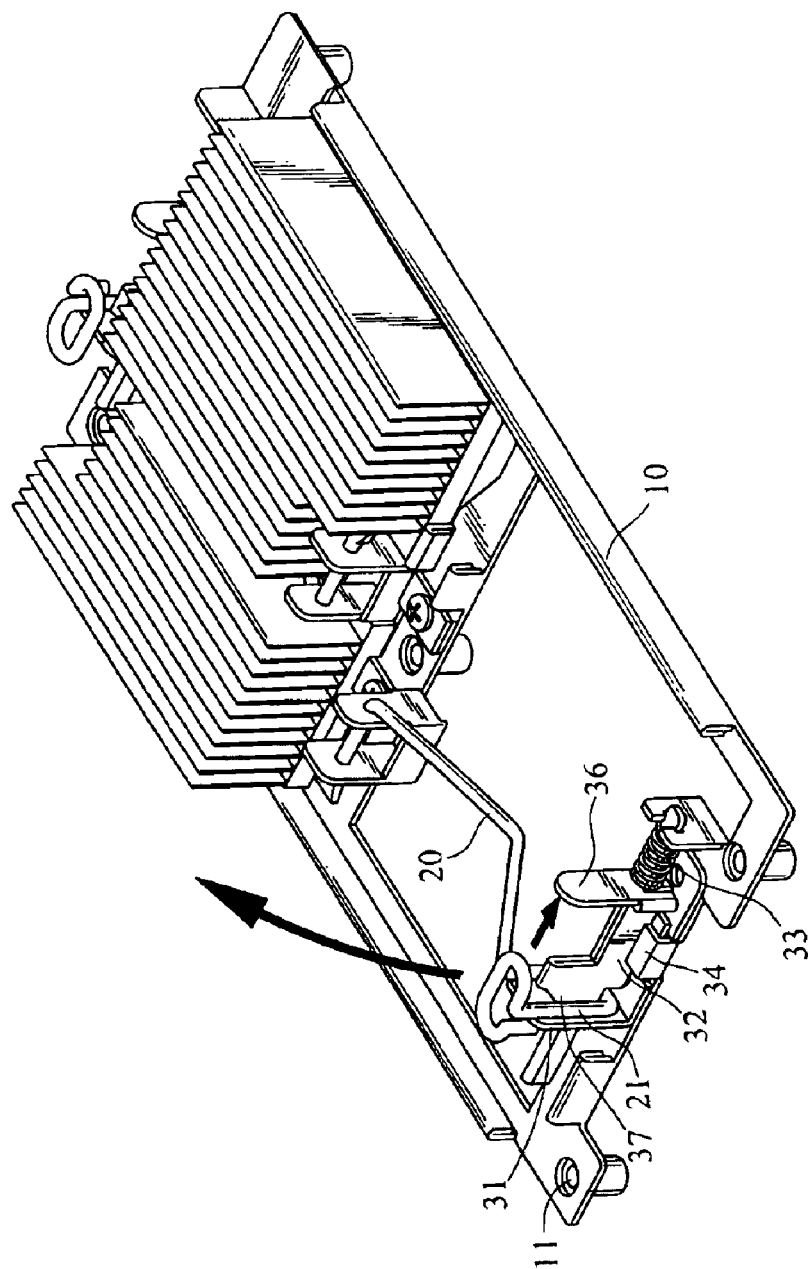
FIG. 3 is a perspective view of a retention module holder coupling with the unlocking mechanism of the invention at the latched position (without the radiator)
Figure 4:
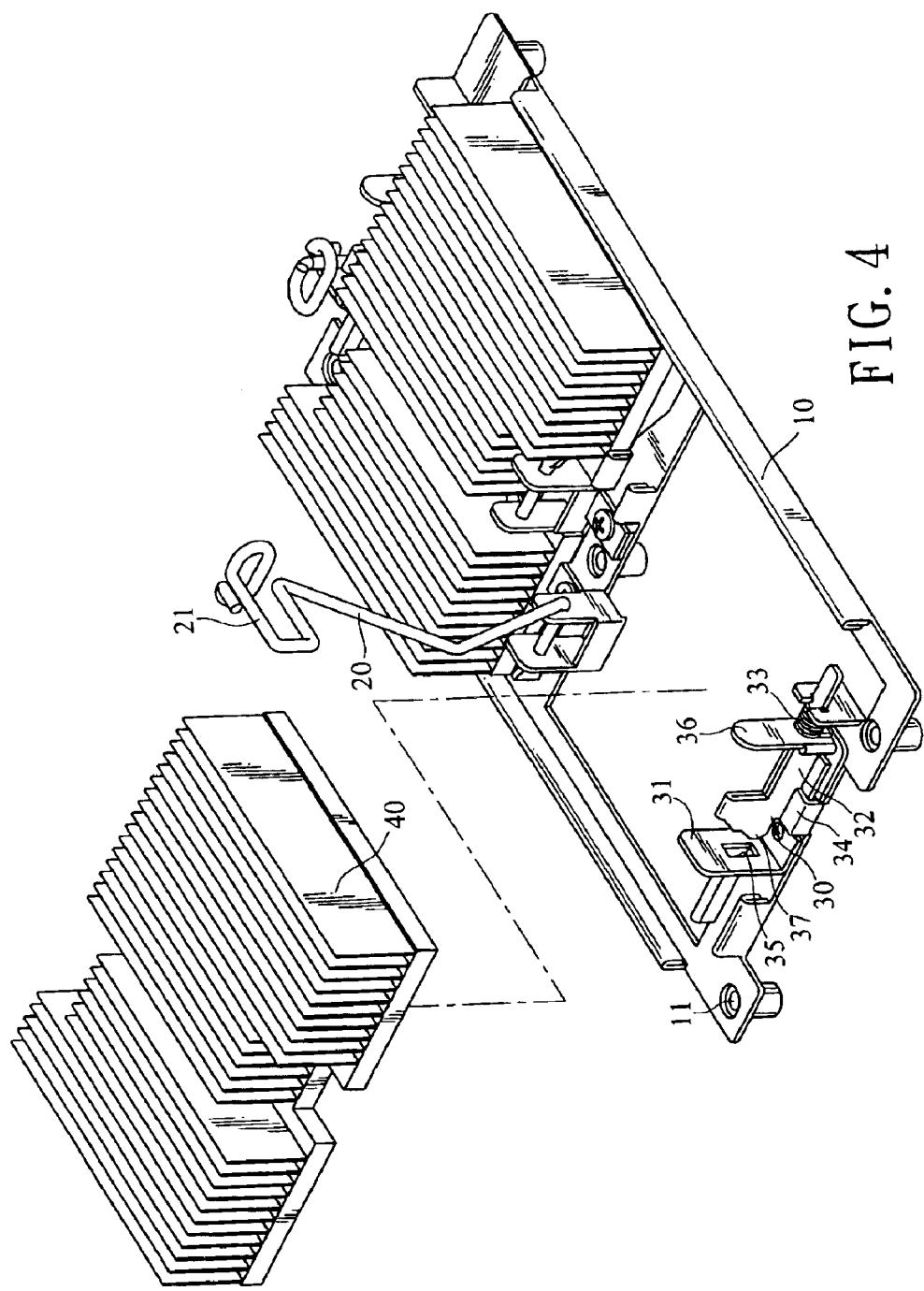
FIG. 4 is a perspective view of a retention module holder coupling with the unlocking mechanism of the invention at the release position (without the radiator)
Figure 5:
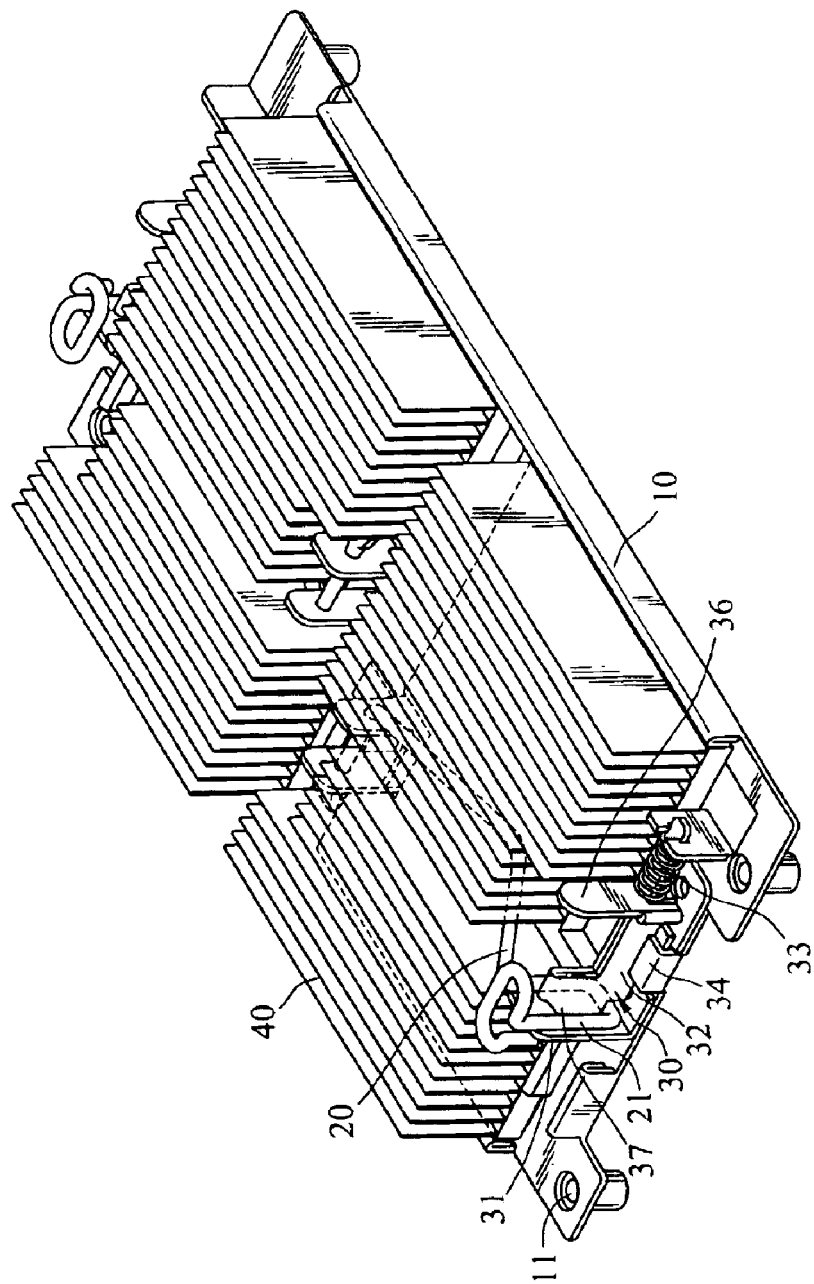
FIG. 5 is a perspective view of a retention module holder coupling with the unlocking mechanism of the invention with the radiator at the latched position.
Figure 6:
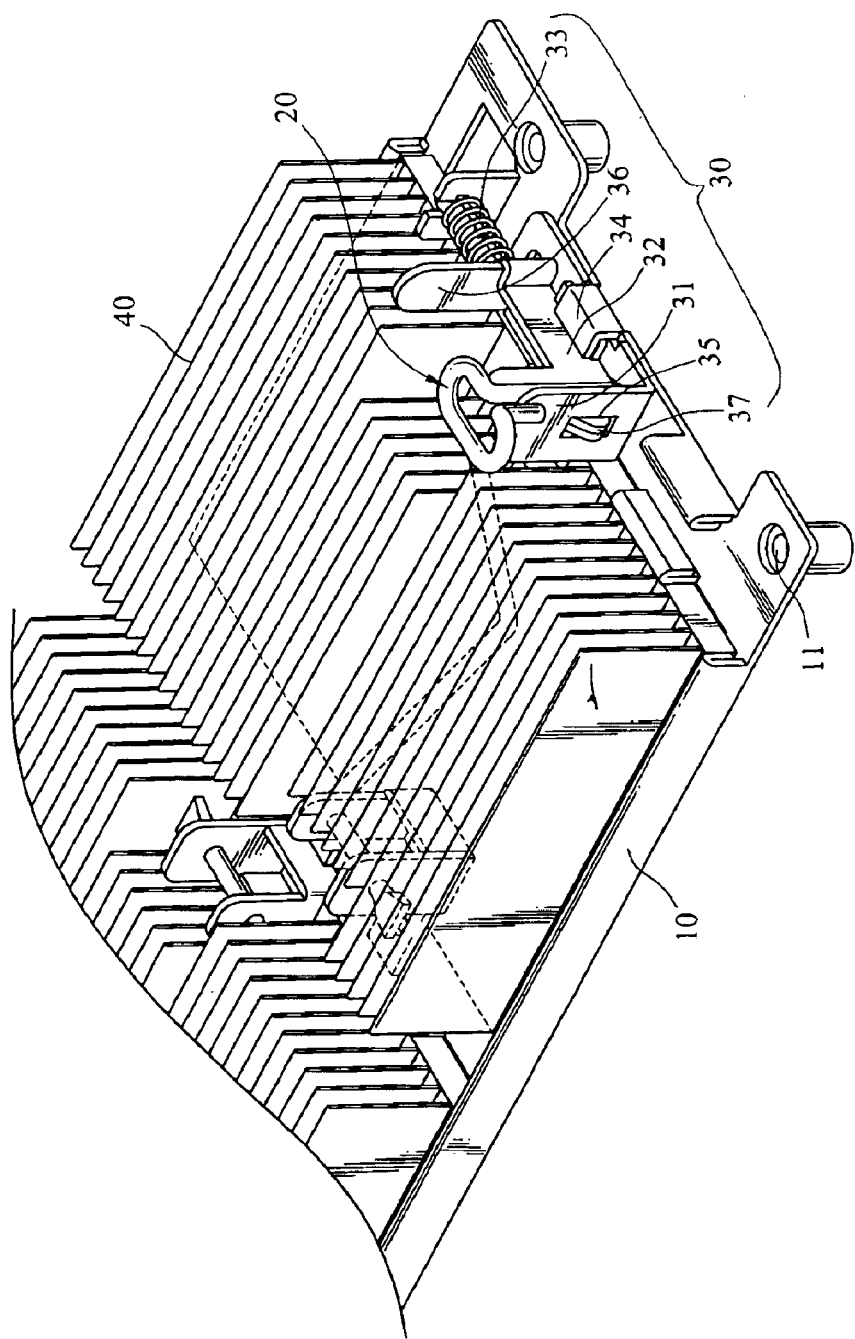
FIG. 6 is another perspective view of a retention module holder coupling with the unlocking mechanism of the invention with the radiator at the latched position.

The locking member 20 has one side pivotally engaged with the fastening stand 10 in a pivotal manner, and the other side opposite to the pivot end forms a latch hook 21 (referring to FIGS. 3 and 4). The locking member 20 may be latched on the radiator 40 at a latched position, and be separated from the radiator 40 at a release position.

An unlocking mechanism 30 is mounted onto the fastening stand 10, and includes a latch ledge 31, a beam 32, a spring 33 and a retaining part 34.

The latch ledge 31 is located on one side of the fastening stand 10 opposite to the free end of the locking member 20 and has an anchor hole 35 corresponding to the locking member 20 at the latched position.

The beam 32 is movably coupled on the fastening stand 10 on one side corresponding to the latch hook 21. The beam 32 has an actuating part 36, and a protruding part 37 opposing the actuating part 36 and corresponding to the latch hook 21 at the latched position.

The spring 33 is coupled on one side of the beam 32 separate from the protruding part 37 to enable the protruding part 37 to engage with the anchor hole 35 in normal conditions. By moving the actuating part 36, the spring 33 is deformed under force and the protruding part 37 is moved.

The retaining part 34 is located on the fastening stand 10 abutting two sides of the beam 32 to allow the beam 32 to slide in a straight line on the fastening stand 10.

When coupling the locking member 20 to the radiator 40, the latch hook 21 on the radiator 40 is depressed between any two radiation fins to slightly deform the locking member 20. The protruding part 37 is wedged into the latch hook 21 and anchor hole 35 to form the latched position.

When separating the locking member 20 from the radiator 40, the actuating part 36 is moved to disengage the protruding part 37 from the latch hook 21 and the anchor hole 35. The restoring force of deformation of the locking member 20 enables the locking member 20 to be separated from the radiator 40 to reach the release position.

The locking member 20 is preferably latched between the radiation fins in the middle portion of the radiator 40. Aside from fastening the radiator 40, the locking member 20 may also increase the structural strength when the radiator 40 is fastened.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A unlocking mechanism for a retention module holder which has a fastening stand for holding a radiator, and a locking member having a first end that is pivotally engaged with the fastening stand and a latch hook on a second end opposing the first end, the second end being latchable to retain the radiator when the locking member is at a latched position, the second end being un-latchable to allow the locking member to separate from the radiator at a release position, the unlocking mechanism comprising:

a latch ledge located on one side of the fastening stand opposite to the first end of the locking member, and having an anchor hole disposed in registration with the latch hook when the locking member is at the latched position;

a beam movably coupled on the one side of the fastening stand, and having an actuating part, and a protruding part opposing the actuating part, the protruding part being engagable with the latch hook when the locking member is at the latched position; and a spring coupled on one side of the beam remote from the protruding part, and which urges the protruding part into engagement with the anchor hole;

wherein when the actuating part is moved by external forces, the spring is deformed and the protruding part is moved to allow the protruding part to disengage with the anchor hole and the latch hook, to allow the locking member to separate from the radiator at the release position, and when the radiator is to be retained, the spring urges the protruding part to engage with the latch hook and the anchor hole, so that the locking member is latched at the latched position and the radiator is retained; and wherein the locking member is slightly deformed at the latched position and has a deformation restoring force to allow the locking member to escape the latched position and reach the release position when the latch hook is disengaged with the protruding part.

2. The unlocking mechanism of claim 1, further comprising a retaining part located on the fastening stand and abutting two sides of the beam to keep the beam moving on a straight line.

3. The unlocking mechanism of claim 1, wherein the fastening stand has at least one fastening hole to receive a fastener to fasten the fastening stand to a heat-generating device.

4. The unlocking mechanism of claim 3, wherein the fastener is a screw.

* * * * *